United States Patent
Fein et al.

(10) Patent No.: US 7,844,568 B2
(45) Date of Patent: Nov. 30, 2010

(54) SYSTEM AND METHOD FOR DATA PROCESSING AND TRANSFERRING IN A MULTI COMPUTER ENVIRONMENT FOR ENERGY REPORTING AND FORECASTING

(76) Inventors: Gene S. Fein, 760 East St., Lenox, MA (US) 01240; Edward Merritt, 139 Lime Kiln Rd., Lenox, MA (US) 01240

( * ) Notice: Subject to any disclaimer, the term of this patent is extended or adjusted under 35 U.S.C. 154(b) by 530 days.

(21) Appl. No.: 11/857,957

(22) Filed: Sep. 19, 2007

(65) Prior Publication Data

US 2009/0076790 A1    Mar. 19, 2009

(51) Int. Cl.
   G06F 15/18    (2006.01)
   G06F 15/00    (2006.01)
(52) U.S. Cl. .......................................... 706/62; 706/21
(58) Field of Classification Search .................... 706/62
   See application file for complete search history.

(56) References Cited

U.S. PATENT DOCUMENTS

| 7,066,050 | B1 * | 6/2006 | Gabrys et al. | 74/572.1 |
|---|---|---|---|---|
| 7,552,100 | B2 * | 6/2009 | Chen | 706/21 |
| 7,566,980 | B2 * | 7/2009 | Fein et al. | 290/2 |
| 7,576,444 | B2 * | 8/2009 | Fein et al. | 290/44 |
| 2007/0185823 | A1 * | 8/2007 | Chen | 706/15 |

OTHER PUBLICATIONS

Assessment of alternative energy sources for generation of electricity in the UK following privatisation of the electricity supply industry, Hammons, T.J.; Geddes, A.G.; Energy Conversion, IEEE Transactions on vol. 5, Issue: 4 Digital Object Identifier: 10.1109/60.63129 Publication Year: 1990, pp. 609-615.*

Modelling and simulation of Solar PV Array under partial shaded conditions, Ramaprabha, R.; Mathur, B.L.; Sustainable Energy Technologies, 2008. ICSET 2008. IEEE International Conference on Digital Object Identifier: 10.1109/ICSET.2008.4746963 Publication Year: 2008, pp. 7-11.*

Estimation of thermal parameters and prediction of temperature rise in crane power cables, Li, H.J.; Generation, Transmission and Distribution, IEE Proceedings—vol. 151, Issue: 3 Digital Object Identifier: 10.1049/ip-gtd:20040376 Publication Year: 2004, pp. 355-360.*

Alternative energy resource from electric transportation, Sutanto, D.; Power Electronics Systems and Applications, 2004. Proceedings. 2004 First International Conference on Publication Year: 2004, pp. 149-154.*

* cited by examiner

Primary Examiner—Michael Holmes

(57) ABSTRACT

At least one embodiment relates to data processing and transferring in a multi computer environment for reporting, monitoring, and predicting the supply, demand, and generation of alternative energy on a global scale. The system is configured to collect past and present alternative energy generation and distribution data from a variety of distributed sources. Example of such distributed data producing sources may include any of various power installations and systems, power sources, and billing systems. The data collected from these sources is stored and contemplated in a central database unit. Based on the data contemplated in the central database unit, the system, further, makes predictions of present and future generations, supply, and demand of alternative energy at local, regional, national, and global scales. Using these predictions, the system recommends changes in the existing energy generation resources, and/or proposes deployment of new energy generation resources.

22 Claims, 6 Drawing Sheets

SYSTEM AND METHOD FOR DATA PROCESSING AND TRANSFERRING IN A MULTI COMPUTER ENVIRONMENT FOR ENERGY REPORTING AND FORECASTING

TECHNICAL FIELD

This disclosure relates generally to the creation of a digital monitoring and reporting system that gauges and models the efficiency of alternative energy distribution systems and makes predictions of present and future generation, supply, and demand of energy on a global scale.

BACKGROUND INFORMATION

Reporting systems for energy gathering installations already exist in the practice. These reporting systems are installed by companies such as Southern California Edison in order to track the power being generated by various owned power generating facilities. These systems are also used to track the power generated by third party facilities that contribute power purchased by the company. Most of these systems register the amount of energy deposited into the grid and also monitor supply and demand during peak and off peak hours. Using these tools, companies such as Southern California Edison manage the resources of their grid and make changes and alterations based upon real time data received from the field.

Currently, an increasing number of alternative energy gathering installations are being built and implemented across the globe. Alternative energy resources include those operating based on factors such as solar power, wind, tidal power, etc. Alternative energy generation systems are typically used to solve local power issues, such as street lights, home or business power needs. Such systems can be interconnected to a grid system for their generated power to be sold to public or private utilities. Currently alternative energy systems such as wind, solar, geothermal and some small hydropower systems generate Megawatt volumes of power. The power generated by these systems may be utilized locally or be interconnected back to the grid system.

Alternative energy resources, due to their nature, are oftentimes dependent on specific conditions in the environment such as the availability of sunshine, wind, and other similar factors, which may vary from day to day and minute to minute. Unlike alternative energy resources, traditional energy resources such as oil, natural gas, coal, and nuclear energy are usually based upon large reserves. Thus the energy gathered by alternative energy resources is somewhat more volatile in its generation and supply than existing traditional power generating systems.

A typical monitoring system employs conventional monitoring models to oversee power generation. Also, the system employs grids in order to model and assess the meeting of demands of power generation. Control centers monitor capacity, maintenance, and production of power plant installations. The data from these installations are absorbed by the main grid control room facilities and further employs to model real time power needs throughout the grid. The obtained data are also used to track the specific amount of energy distributed into the grid by suppliers as well as the amount of energy utilized by customers for the purpose of billing.

Monitoring systems are configured to be able to alternate between various power resources in order to supply different parts of the grid with power. The alternation is done based upon need and the ability to construct a certain amount of redundancy to supply power to certain parts of the grid where possible.

SUMMARY OF THE DISCLOSURE

The existing conventional uses for reporting and monitoring systems have certain limitations in distribution and deployment as it applies to the generation of alternative energy. Currently, there is not an alternative energy monitoring system that can monitor the probability of future energy gathering as a function of factors such as energy supply and demand, capacity of systems, environmental resources on a global scale.

Current energy monitoring systems are configured for traditional power installations and hence can not be used to maximize productivity of new systems. Accordingly, there is a need for an energy monitoring system that has the ability to monitor current and past events, and can also use the obtained monitoring data, along with other factors, to make predictions of future events that can be used to advance distribution needs.

At least one embodiment relates to an integrated local, regional, and global alternative energy tracking, reporting, maintenance, and billing system for a power generation infrastructure. This system can be easily connected to monitor multiple direct or indirect power resources as well as various grid interconnection points and non-connected grid points. The system may take into account weather patterns, past performance by a power generation installation, present performance, degradation of the system over time, the effect of maintenance and repair, current weather forecasts, future weather forecasts, climatic data, traumatic or unexpected events that cause or may cause disruption or unusual system activity, grid effectiveness in specific and aggregate areas. Data obtained may be used to model past, current, short and long term analysis of alternative energy power generation, monitoring, capacity, functionality, forecasting, billing, maintenance impact and management effects on the grid as well as integration with reporting and monitoring of traditional energy sources.

The digital monitoring and prediction of at least one embodiment is based on data reported from generated distributions of alternative energy at local, regional, national, and global scales. At least one embodiment employs factors such as environmental conditions, historical data, efficiency of the systems, and unit specific deployed infrastructure to generate predictions of future generation, supply, and demand on a global scale.

In order to collect data used in prediction, at least one embodiment may utilize data collection means such as sensors, relays and micro sensors. The data are sent to the main database system, which synthesizes the data. The resulting data are made available via default reporting settings as well as via sortable specific data sets all available via the reporting program application and General User Interface (GUI). Differing versions of the GUI are made available depending on granted system access.

The system collects past and present information gathered from sources such as various power installations and systems, power sources, and billing systems. The data from these sources are stored and contemplated by a central processing unit. The system accounts for factors such as demand, environmental and historical issues, and system efficiency to make predictions about the present and future energy generation, supply and demand. Based on these predictions, the system generates recommendations as to changes in existing system and/or outputs proposals for new energy generation resources.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating principles of example embodiments.

DETAILED DESCRIPTION OF EMBODIMENTS

A description of example embodiments follows. At least one embodiment relates to the creation of a reporting, monitoring and prediction system 100 for alternative energy generation and distribution on a global scale.

Figure 1:
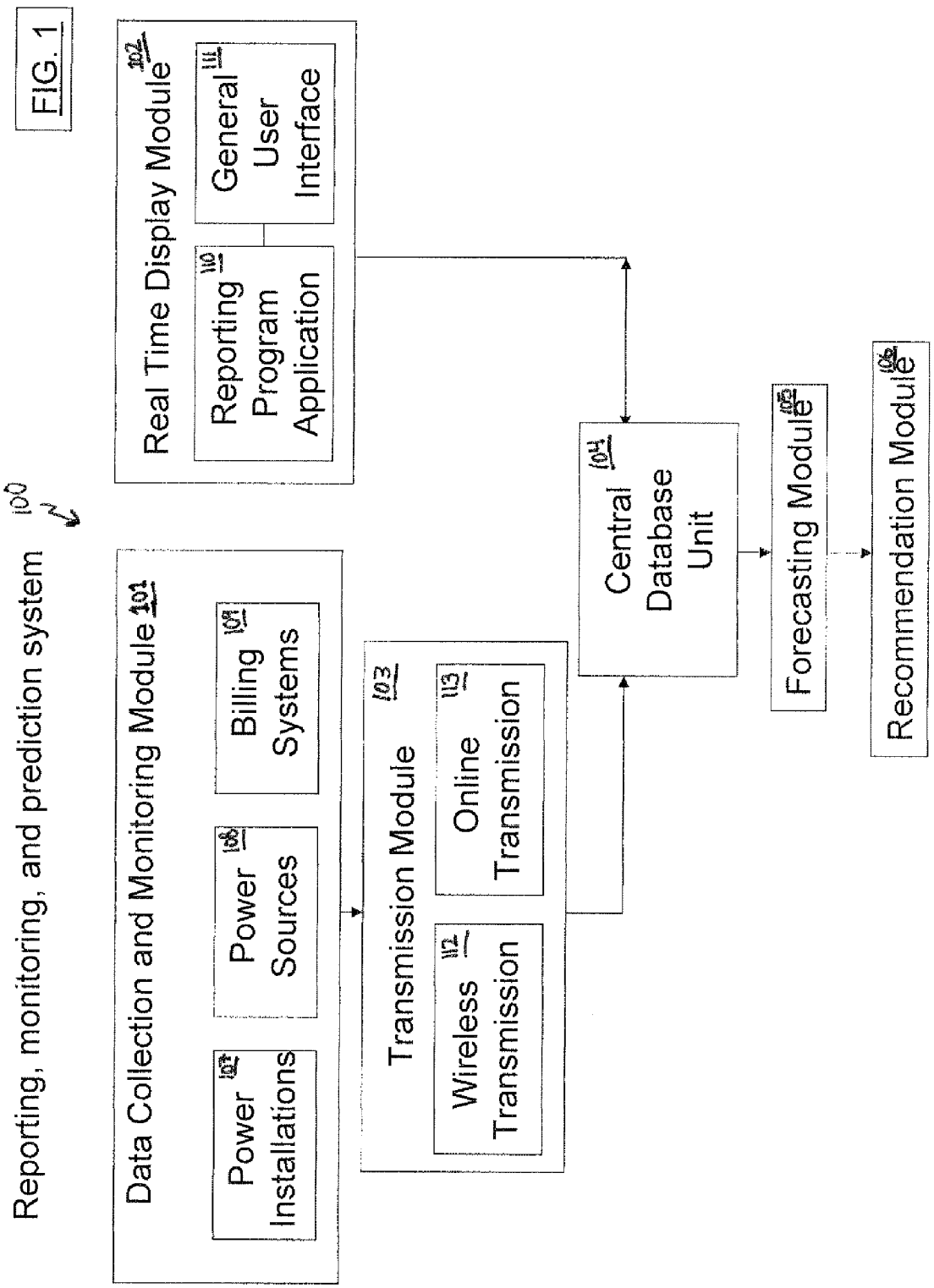
FIG. 1 is a top level schematic representation of the reporting, monitoring, and prediction system, according to one embodiment.

The top level schematic representation of the operation of the system 100 is shown in FIG. 1. The data collection and monitoring module 101 is configured to monitor and collect past and present alternative energy generation and distribution data from a variety of sources. The collected data may include power generation information across various locations and energy distribution flow information. Example data producing sources may include any of various power installations and systems 107, power sources 108, and billing systems 109. The data from these sources 107, 108, 109 are collected, stored, and contemplated in a central database unit 104. The data are transmitted to the central data base unit 104 via a transmission module 103. The transmission module 103 may employ any of an online transmitter 113 or a wireless transmitter 112 to transmit the data to the central database unit 104. Known communication, networking, and other data communication techniques may be used.

The system 100 is configured such that it can be connected to monitor alternative generation and distribution in any of multiple direct power sources, indirect power sources, various grid interconnection points and non-connected grid points. The monitoring is done both at mobile gathering solutions such as vehicle installations and their portable batteries, as well as at fixed installations such as wind turbines, solar farms, power generation plants, individual solar panels or sheets, geothermal installations, human powered or mechanical energy driven generation such as cranks and hybrid combinations of the above.

Figure 4:
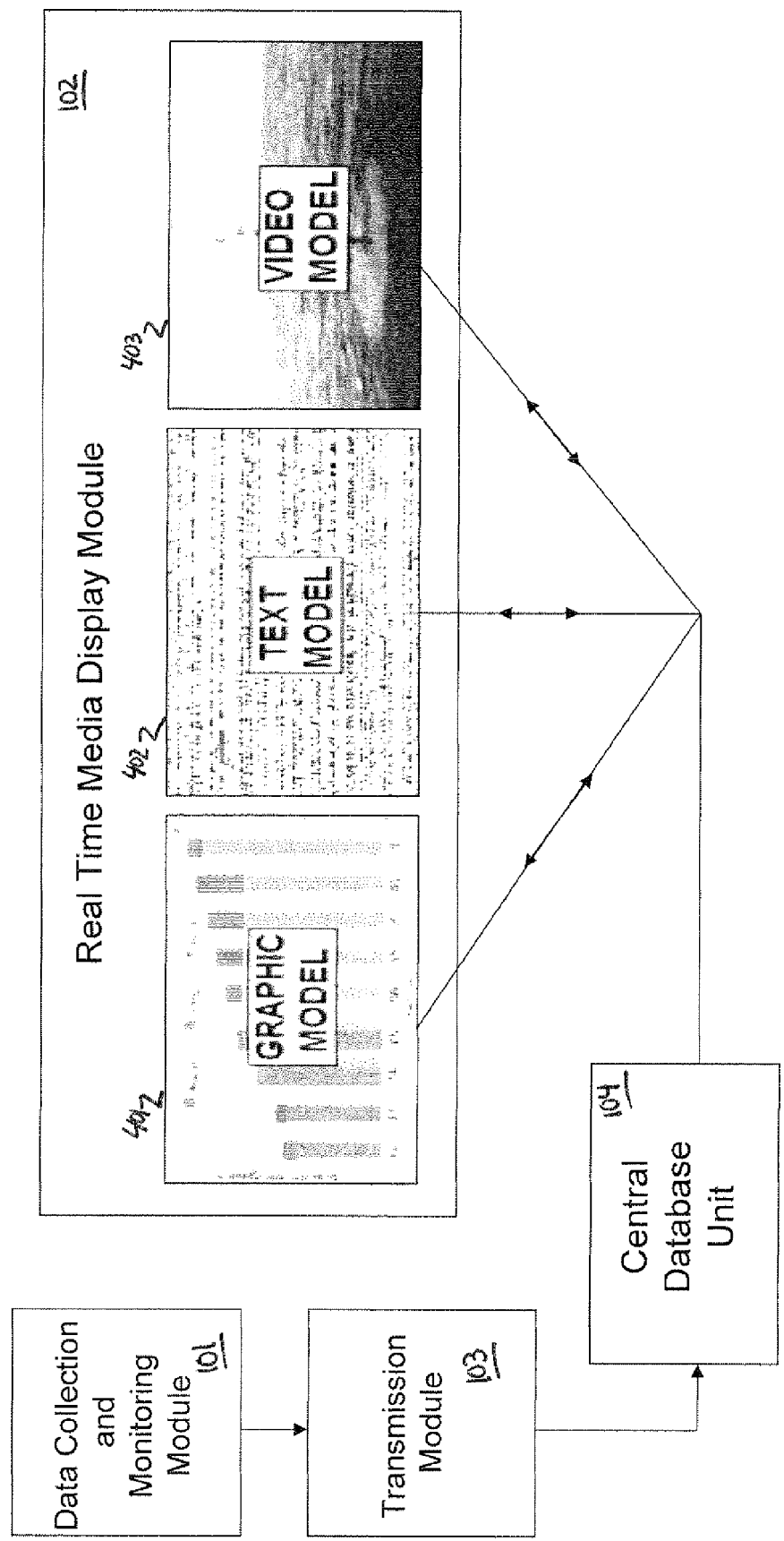
FIG. 4 depicts the different reporting means for real time display module of the embodiment of FIG. 1.

The reporting is done via a default reporting program application 110 and a GUI 111 in the form of any of graphic model 401, text model 402, and/or video model 403 (FIG. 4). The system 100 makes differing versions of the GUI 111 available depending on granted system access. All information obtained from the reporting program 110 and GUI 111 are displayed in real time, archived and updated back into the central database unit 104, where they are contemplated and subsequently fed into a prediction and forecasting module 105. The resulting forecasted information then enters a recommendation module 106, wherein the system 100 generates recommendations as to changes to the existing system and/or generates proposals for deployment of new energy generation resources.

Figure 2:
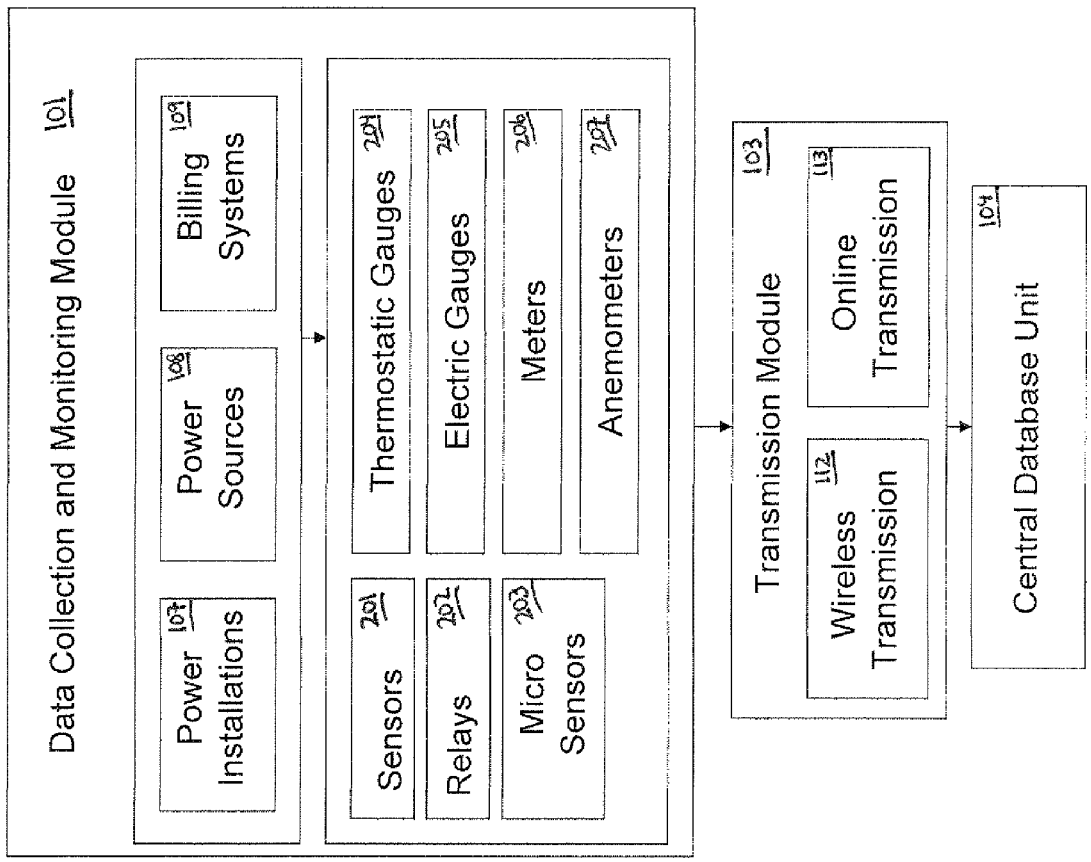
FIG. 2 is a flow chart depicting the process of data collection in the data collection module of the embodiment of FIG. 1.

The schematic of the data collection module 1 is illustrated in FIG. 2. The system 100 (module 1) collects data related to factors such as power generation information, energy distribution flow information, and power demand information across various locations of the globe. Example data-producing sources may include any of various power installations and systems 107, power sources 108, and billing systems 109. In order to collect data from these sources 107, 108, 109, the system 100 may utilize a variety of mechanisms depending on the data source involved in data collection. For instance when collecting supply, demand, and efficiency data from power installations 107, the system may employ tools such as sensors 201, relays 202, and micro sensors 203 to measure power generation and flow. Additionally, for demand and efficiency data, the system may collect information from power sources 108 and billing systems 109 through the use of mechanisms such as thermostatic gauges 204, electric gauges 205, meters 206, and/or anemometers 207.

Figure 3:
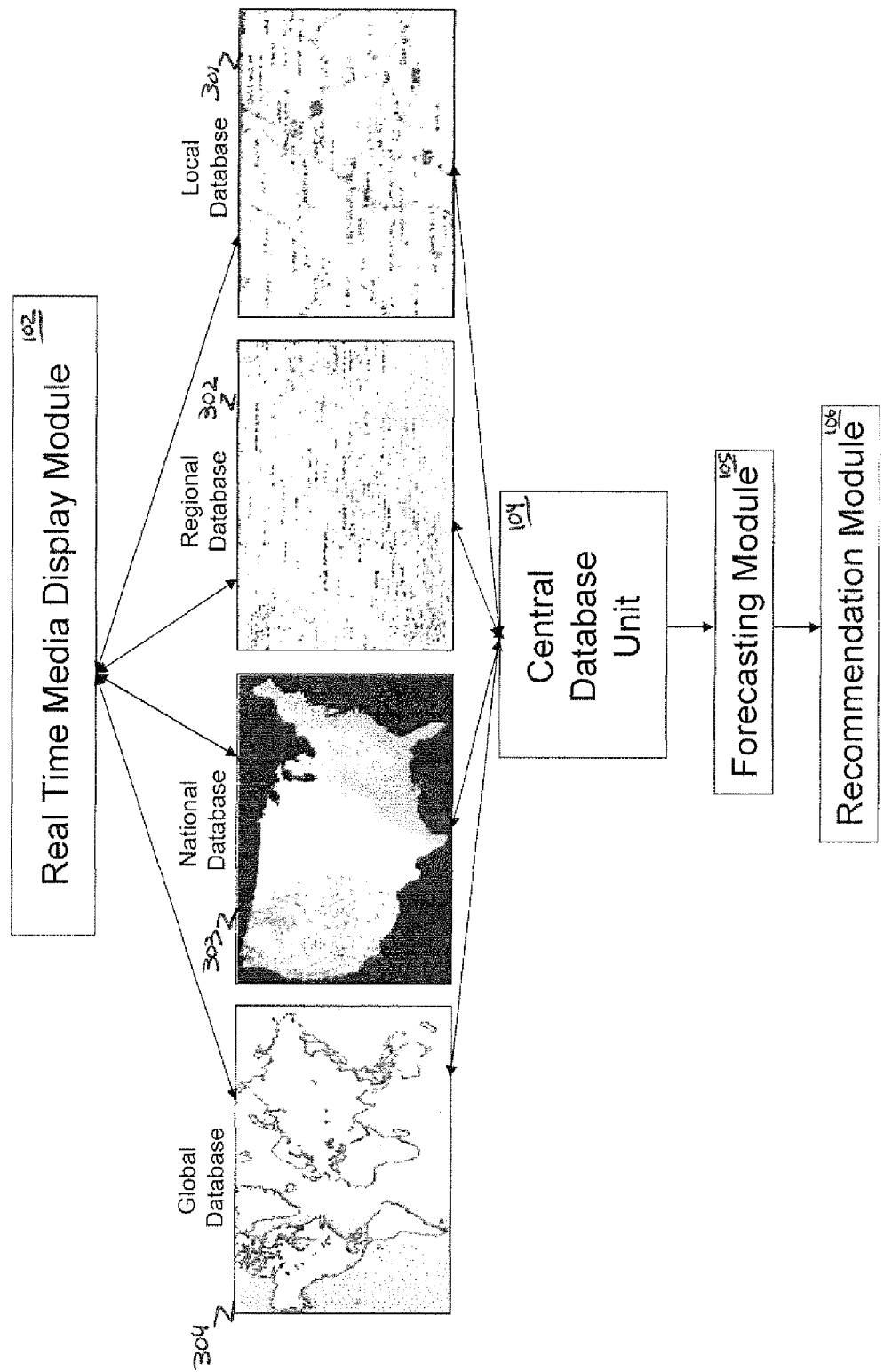
FIG. 3 illustrates the real time display module of the embodiment of FIG. 1.

Due to the nature of alternative energy, generation and distribution resources and their respective controlling factors may be spread across various locations of the globe. For instance, the amount of alternative energy generated and supplied through sources such as wind, waves or solar power may be affected by environmental and/or geological factors occurring across the globe. Moreover, the demand and efficiency of alternative energy systems are also affected by global factors, including existing power supply, the current state of power generation technology, population growth, pricing, geopolitical changes, and population migration. Hence the system 100 is configured to aggregate each piece of data obtained from regional 302, local 301, national 303, and globe 304 scales, as illustrated in FIG. 3 (documented later). Given the vast range of locations from which monitoring data may be obtained, the system 100 incorporates a transmission module 103 that is configured to transmit the information from the data collection module 101 to the central database unit 104. Depending on the data generation source, the transmission module 103 may employ any of an online transmitter 113 or a wireless transmitter 112. Known communication, networking, and other data transmission techniques may be employed. The data transferred by the transmission module 103 to central database unit 104 are collected and stored there for further processing.

FIG. 3 illustrates the scales under which the alternative energy data are monitored, collected, and displayed. The system 100 collects data related to factors such as power generation information, energy distribution flow information, and power demand information. Since both the generation and demand for alternative energy are influenced by various factors across the globe, the system 100 aggregates each piece of data obtained from regional 302, local 301, national 303, and global 304 scales. The information collected by the data collection module 101 is transmitted via the transmission module 103 to the central database unit 104, where they are collected, stored, and synthesized. The synthesized data from the central database unit 104, are then fed into a real time display module 102 and made available in real time using a default reporting settings 110 as well as a GUI 111. The real time display module 102 makes available and displays each piece of data from both the demand and generation points of energy distribution at local 301, regional 302, national 303, and global scales 304. All information available from the reporting program 110 and GUI 111 are archived and updated in real time back into the central database unit 104, where they are contemplated and subsequently used in forecasting via the forecasting module 105. The predicted information is further processed by a recommendation module 106, wherein the system generates recommendations as to changes to the existing system and/or generates proposals for deployment of new energy generation resources.

FIG. 4 depicts the different reporting means for the reporting program application 110 and the GUI 111 of real time display module 102. Since the collected data for the system 100 come from a variety of sources, there are various models under which the data are monitored and collected. Hence, the system 100 may obtain the data in the form of any of a graphic model 401, text model 402, and/or video model 403. An example of the graphic model 401 is the case of charts displaying past and/or present unit energy consumed by a certain energy user or a group of users in a region, town, continent or on a global scale.

Another example of a situation under which the system 100 may obtain data from any of a graphical 401, text 402 or video models 403 is when the system 100 collects the monitoring data from a seismic monitoring source. In such cases, the seismic monitor continuously outputs graphic and text data about geological activities. Such monitoring systems relay information regarding the occurrence of an earthquake by reporting facts regarding the corresponding date, latitude, longitude, magnitude, depth and region in the form of seismograms and/or printed text.

An example of a video monitoring system includes video monitors set up to monitor streams, shorelines, and waves. The video images obtained can be further processed in order to obtain information with regards to factors such as wave intensity and intensity of water.

Since both the generation and demand of alternative energy are reported through mediums explained above and given that the system 100 relies on such information to obtain predictions and recommendations, the system 100 is set up to collect the monitoring data from any of graphic 401, text 402, and/or video 403 model. The collected data from these models 401, 402, 403 are sent to the central database unit 104, where they are collected, stored and sent to the real time display module 102 to be displayed in real time. The reporting is done via a default reporting program application 110 and GUI 111. The system 100 makes differing versions of the GUI 111 available depending on granted system access. The real time display module 102 displays the collected data in the form of any of a graphic model 401, text model 402, and/or video model 403. All information obtained from the reporting program 110 and GUI 111 are archived and updated in real time back into the central database unit 104, where they are contemplated and subsequently used in forecasting and recommendation via the forecasting 105 and recommendation 106 modules.

Figure 5:
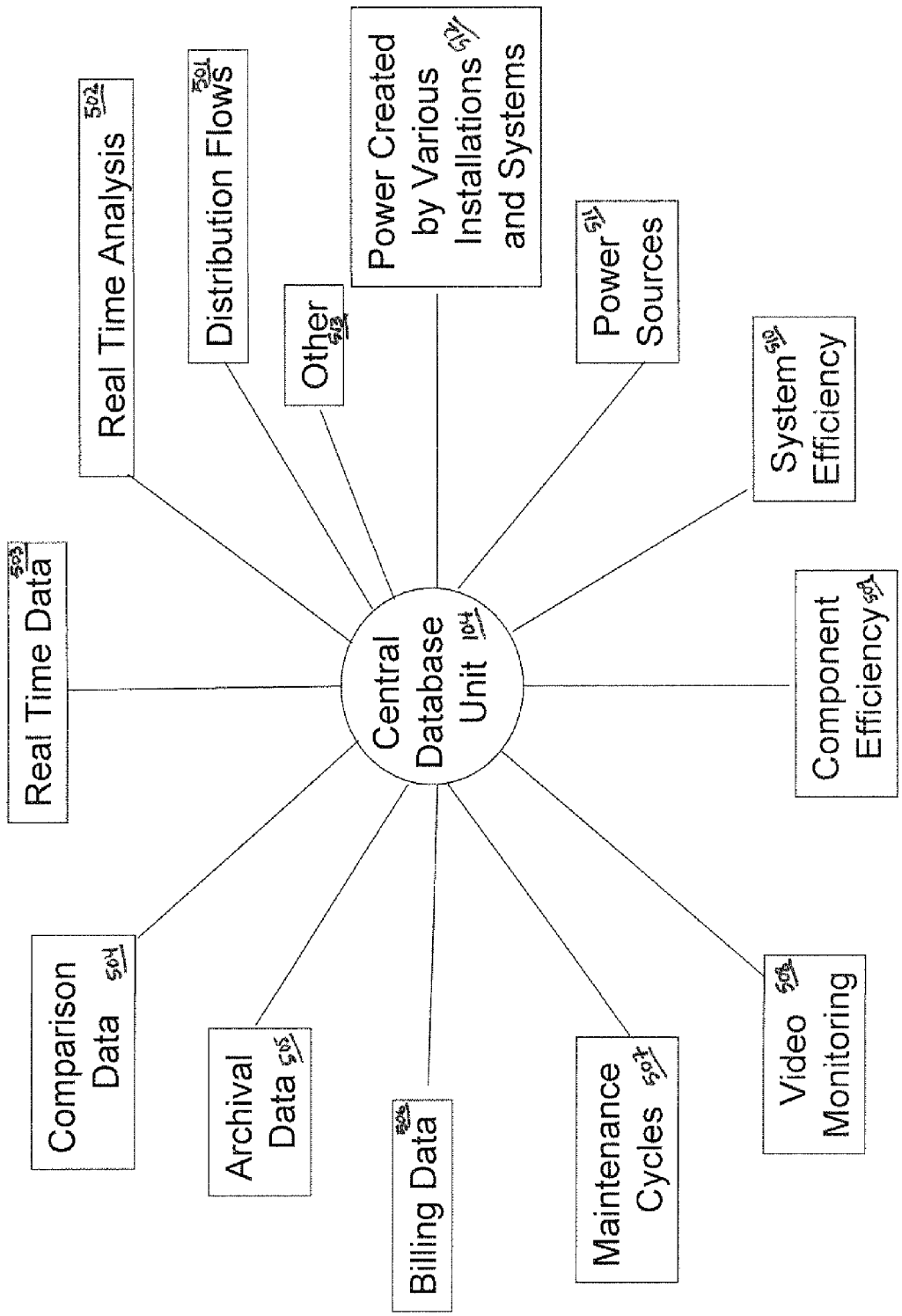
FIG. 5 is a schematic illustration of the parameters contemplated by central database unit of the embodiment of FIG. 1.

FIG. 5 illustrates a schematic illustration of the parameters contemplated by the central database unit 104. The central database unit is responsible for collecting, storing and contemplating data obtained from both the data collection and monitoring module 1 and the real time display module 102. Once these parameters are collected, stored, and processed by the central database unit 104, the processed data 612 (FIG. 6) is fed into the forecasting module 105, where it is used to forecast present and future generation and supply of alternative energy.

The parameters contemplated by the central database unit 104 include any of power created by various power installations and systems 512, distribution flows 501, power sources 511, system efficiency 510, component efficiency 509, video monitoring 508, maintenance cycles 507, billing data 506, archival data 505, comparison data 504, real time data 503, and real time analysis 502.

In addition to the above parameters 501, 502, 503, 504, 505, 506, 507, 508, 509, 510, 511, 512, the central database unit 104 synthesizes other parameters 513 that the system 100 may employ in the process of forecasting (performed in module 105). Other forecasting parameters 38 contemplated by the central database unit 104 include installed systems in the field 614, customer base 602, customer demand 603, historical demand 603, demand volatility 603, projected demand based upon historical demand 603, daily conditions based upon past demand extrapolated to present demand 603, weather conditions 604, geopolitical conditions 610, efficiency of new and aging systems 601, predictors on new system impact and old system closures 605, grid distribution 606, power generation created by smaller utilities and private individuals 608, increases in certain types of power generation 608, decreases in certain types of power generation 608, relative pricing 607, incentives 611, disaster forecasting 103, population growth 104, immigration and emigration forecasting 105, and present resources 106.

In order to collect, store, and synthesize these parameters 501, 502, 503, 504, 505, 506, 507, 508, 509, 510, 511, 512, 513, 601, 602, 603, 604, 605, 606, 607, 608, 101, 102, 103, 104, 104, 105, 106, the central database unit 104 employs known data collection, data storage, and data and signal processing tools.

Figure 6:
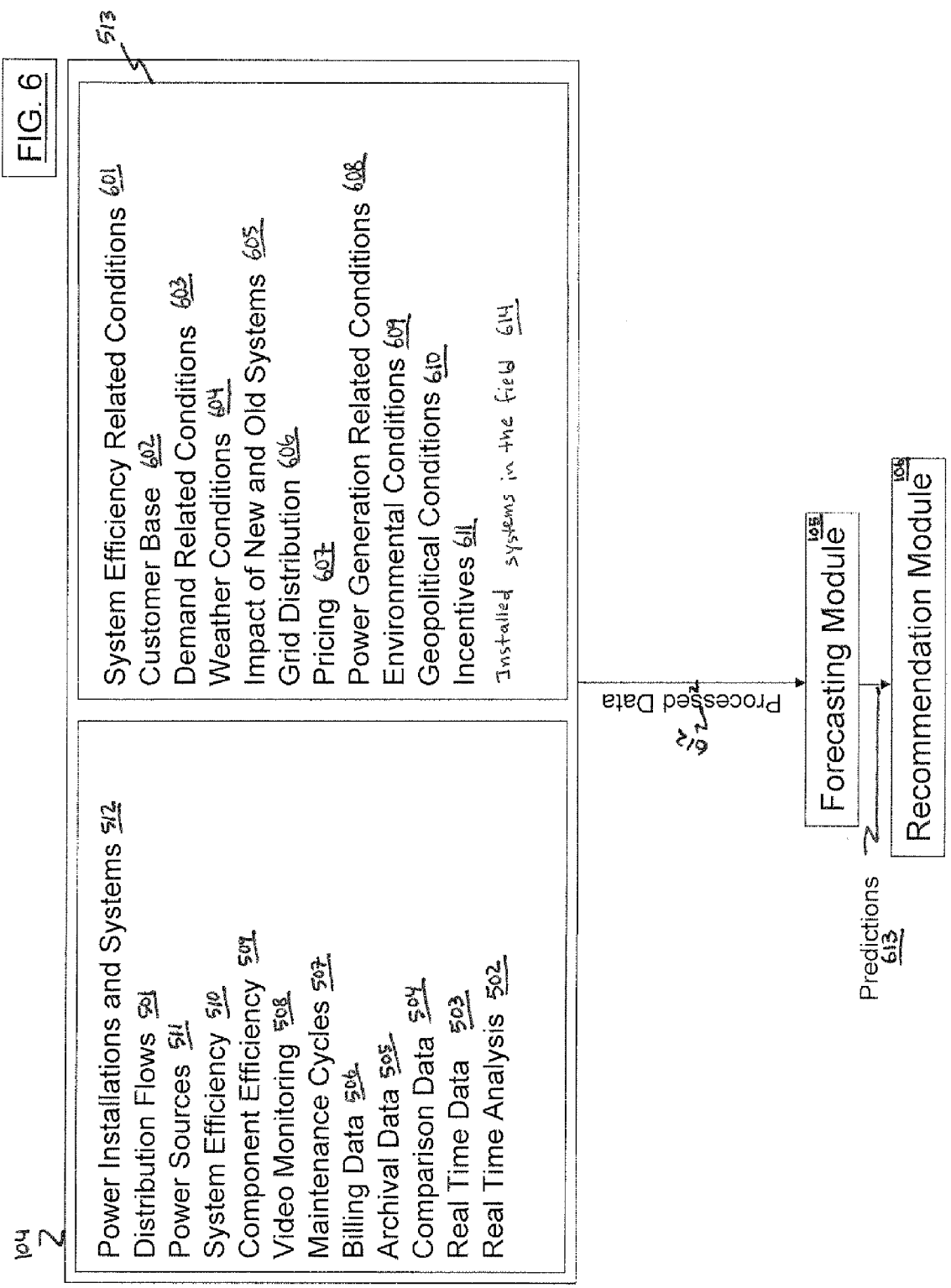
FIG. 6 is a schematic illustration of the alternative energy forecasting and recommendation Modules of the embodiment of FIG. 1.

FIG. 6 illustrates the schematics of the forecasting module 105 of the system 100. The forecasting module 105 employs forecasting factors such as installed system in the field 101, customer base 602, customer demand 603, historical demand 603, demand volatility 603, projected demand based upon historical demand 603, daily conditions based upon past demand extrapolated to present demand 603, weather conditions 604, geopolitical conditions 610, efficiency of new and aging systems 601, predictors on new system impact and old system closures 605, grid distribution 606, power generation created by smaller utilities and private individuals 608, increases in certain types of power generation 608, decreases in certain types of power generation 608, relative pricing 607, incentives 611, disaster forecasting 103, population growth 104, immigration and emigration forecasting 105, and present resources 106. The synthesized data are maintained in the central database unit 304 and fed 612 to the forecasting module 105. In order to form synthesized data 612, the central database unit 104 may employ techniques such as preprocessing, normalizing, sampling, denoising, transformation, feature extraction, data/time ordering, as well as other data mining and preprocessing methods available in the art.

The forecasting module 105 may employ various forecasting methods to make predictions of present and future supply, demand, and generation of alternative energy. Examples of such methods include time series forecasting method, seasonally adjusted time series method, least-value forecasting, averaging forecasting, moving average forecasting, exponential smoothing forecasting, extrapolation, trend estimation, growth curve, casual forecasting, and other methods available in the art.

As noted above, once past and present observations are processed by the central database unit 104, the processed data 612 are transferred to the forecasting module 105, where they are used to make present and future predictions of supply, demand, and generation of alternative energy. The forecasting module 105 employs available data processing and weighting techniques to contemplate the processed data 612.

In an example embodiment, the forecasting module 105 may determine the values for past supply $S_p$, demand $D_p$, and generation $G_p$ of alternative energy as a function of the processed data 612. Specifically:

$$(S_p, D_p, G_p) = f(O),$$

where $O$ denotes processed data 612, and $f$ denotes any weighting, preprocessing and/or processing techniques used.

Similarly, the present supply S, demand D, and generation G of alternative energy may be obtained as a function of processed data 612 O:

$$(S, D, G) = f(O),$$

where $f$ denotes any weighting, preprocessing and/or processing techniques used.

The system 100 may employ the corresponding values of past supply $S_p$, demand $D_p$, and generation $G_p$ of alternative energy to forecast the present values of supply S, demand D, and generation G of alternative energy $$(F_S, F_D, F_G) = f(S_p, D_p, G_p, O),$$

where $F_S$, $F_D$, and $F_G$ denote the respective forecasted values for present supply S, demand D, and generation G of alternative energy, and $f$ denotes any weighting, preprocessing and/or processing techniques used.

The forecasting module 105 employs past and present values of supply, demand, and generation of alternative energy to make prediction about their respective future values. The forecasting may be done based on any variation of past, actual present, and/or predicted present supply, demand, and generation of alternative energy. For example, forecasted supply $F_{F_S}$, demand $F_{F_D}$, and generation $F_{F_G}$ of alternative energy may be determined as a function of past and present observations:

$$(F_{F_D}, F_{F_S}, F_{F_G}) = f(S_p, D_p, G_p, S, D, G, O),$$

where $f$ denotes any weighting, preprocessing and/or processing techniques used.

In another embodiment, future supply $F_{F_S}$, demand $F_{F_D}$, and generation $F_{F_G}$ of alternative energy may be determined as a function of past observations along with predicted present observations:

$$(F_{F_D}, F_{F_S}, F_{F_G}) = f(S_p, D_p, G_p, F_S, F_D, F_G, O),$$

where $f$ denotes any weighting, preprocessing and/or processing techniques used.

In another embodiment, the future supply $F_{F_S}$, demand $F_{F_D}$, and generation $F_{F_G}$ of alternative energy may be determined as a function of past observations along with both predicted and actual present observations:

$$(F_{F_D}, F_{F_S}, F_{F_G}) = f(S_p, D_p, G_p, S, D, G, F_S, F_D, F_G, O),$$

where $f$ denotes any weighting, preprocessing and/or processing techniques used.

The forecasting module 105 may employ any available forecasting error determination methods to determine the error involved in its prediction of present and future supply, demand, and generation of alternative energy. The obtained forecasting error may further be used to improve the forecasting system. Improvements in the forecasting system may include any of comparing various forecasting methods and selecting one that results in lower error and/or helping to select additional parameters that may be used in forecasting.

Each data piece is aggregated to both the demand point and the generation points of the energy. The energy is then modeled in real time and future conditions in seconds, minutes, days, weeks, months, years, decades and centuries are then modeled factoring in all of the variables above to predict how needs may be met, and what vulnerabilities exist in the system. By gauging lifespan of all installed equipment, new equipment coming into the field, and external conditions such as global warming, historical data trends, population growth projections, disaster forecasting, short term, long term, and emerging trends the system can effectively model the future needs. In turn system 100 makes recommendations for achieving those needs based upon available installation resource platforms.

The prediction 613 obtained from the forecasting module 105 is further fed into a recommendation module 106, wherein the system generates recommendations as to changes to the existing system and/or generates proposals for deployment of new energy generation resources.

The recommendation produced by the recommendation module 106 may include proposals for changes to existing systems and/or deployment of new systems. For instance, the recommendation module 106 may take in predictions 613 such as environmental factors (weather 604), forecasted customer base 602, forecasted customer demand 603, historical demand 603, and projected demand 603 to recommend deployment of available distributed power generation sources 512. Similarly, the recommendation module 106 may take into account the number of available of power generation sources 512 and recommend that additional sources 512 need to be added to the system.

An example of such recommendation system is the case of a municipal or a state/provincial alternative energy generation 512 and distribution network. The customer base 602 and customer demand 603 in such case vary over time based on factors such as population growth 104, migration 105 patterns in and out of the region, geopolitical conditions 610, as well as other factors. Additionally, the generation and supply of alternative energy may vary based on factors such as weather conditions 604, efficiency of new and aging systems 601, as well as other factors. Over time, the recommendation module 106 considers the forecasted changes in each of the above mentioned factors 512, 602, 603, 104, 105, 48, 604, 601. The recommendation module 106 may recommend deployment or addition of new power generation sources 512 when an increase in future demand is predicted by the forecasting module 105 or when current resources are not expected to satisfy future demand. Additionally, the recommendation module 106 may employ financial factors in making its recommendations with regards to addition of new systems and/or an increase in the number of currently available systems deployed. Alternatively, the recommendation module may consider the forecasted drop in customer base 602 and/or other factors to suggest that a fewer number of power generation sources 512 be deployed, or that currently deployed systems be decommissioned.

The recommendation module 106 may employ known recommendation and decision making, decision analysis, and sensitivity analysis techniques available in the art.

Although example embodiments have been described and illustrated in detail, it is to be understood that a person skilled in the art can make modifications to the example embodiments. For instance it is understood that the principles of the example embodiments may be applied in a wide variety of other distributed data processing applications such as market, economy, and sales data reporting and forecasting.

What is claimed is:

1. A method for monitoring alternative energy, the method comprising:
    collecting from a plurality of distributed sources alternative energy generation and distribution data;
    storing the alternative energy generation and distribution data in a central database unit; and
    using the alternative energy generation and distribution data to predict generation, supply, or demand of alternative energy, thereby resulting in predicted alternative energy data.

2. The method of claim 1, further comprising:
    reporting the predicted alternative energy data on a local, regional, national, or global scale.

3. The method of claim 2, wherein reporting the predicted alternative energy data includes displaying the predicted alternative energy data as a graphic model, text model, or video model.

4. The method of claim 3, wherein displaying the predicted alternative energy data as a graphic model, text model, or video model depends on granted system access.

5. The method of claim 1, wherein the plurality of distributed sources includes power installations, power sources, or billing systems.

6. The method of claim 1, further comprising:
    contemplating the alternative energy generation and distribution data in the central database system, the alternative energy generation and distribution data including data from any of power installations and systems, distribution flows, power sources, system efficiency, component efficiency, video monitoring, maintenance cycles, billing data, archival data and comparison data, real time data, and real time analysis.

7. The method of claim 1, further comprising:
    transmitting data to the central database unit using an online transmitter or a wireless transmitter.

8. The method of claim 1, wherein the step of predicting is based on any one or more of volatility of the alternative energy source, weather conditions, weather forecasts, geological conditions, geopolitical conditions, alternative energy generation by smaller utilities and private individuals, and disaster forecasting.

9. The method of claim 1, wherein the step of predicting includes predicting generation, supply, or demand of alternative energy over a period of days, weeks, months, years, decades, or centuries.

10. The method of claim 1, further comprising:
    monitoring alternative energy distribution through data collection means including sensors, relays, micro sensors, thermostatic gauges, electric gauges, electric meters, or anemometers.

11. The method of claim 1, further comprising:
    monitoring alternative energy distribution in direct power sources, indirect power sources, grid interconnection points, or non-connected grid points.

12. The method of claim 11, wherein the monitoring is done using mobile gathering solutions or fixed installations.

13. The method of claim 12, wherein mobile gathering solutions may include vehicle installations and their portable batteries.

14. The method of claim 12, wherein fixed installations may include any of wind turbines, solar farms, power generation plants, individual solar panels or sheets, geothermal installations, human powered or mechanical energy driven generation, and hybrid combinations of the above.

15. A computer implemented method for analyzing alternative energy power generation, the method comprising:
    modeling alternative energy power generation conditions, thereby resulting in modeled conditions;
    based on the modeled conditions, predicting future alternative energy power generation conditions, thereby resulting in predicted future conditions; and
    as a function of the predicted future conditions, generating recommendations as to changes in alternative energy power generation resources.

16. The method of claim 15, wherein the alternative energy power generation conditions include any one or more of power created by power installations and systems, distribution flows, power sources, system efficiency, component efficiency, video monitoring, maintenance cycles, billing data, archival data and comparison data, real time data, real time analysis, volatility of the alternative energy source, weather conditions, weather forecasts, geological conditions, geopolitical conditions, alternative energy generation by smaller utilities and private individuals, and disaster forecasting.

17. The method of claim 15, wherein the future alternative energy power generation conditions include any one or more of future energy supply, future energy demand, future energy generation, future equipment needs, future energy gathering, future distribution needs, future availability of sunshine, future availability of wind, future maintenance, future repair, future degradation of the system, future capacity, future functionality, future billing, and future management effects.

18. A computer apparatus for monitoring alternative energy, the apparatus comprising:
    means for collecting from a plurality of distributed sources, alternative energy generation and distribution data;
    means for storing the alternative energy generation and distribution data in a central database unit; and
    means for using the alternative energy generation and distribution data to predict generation, supply, or demand of alternative energy.

19. The apparatus of claim 18, further comprising:
    means for reporting predicted generation, supply, or demand of alternative energy on a local, regional, national, or global scale.

20. The apparatus of claim 18, further comprising:
    means for contemplating the alternative energy generation and distribution data in central database system, the alternative energy generation and distribution data including data from any one or more of power installations and systems, distribution flows, power sources, system efficiency, component efficiency, video monitoring, maintenance cycles, billing data, archival data and comparison data, real time data, and real time analysis.

21. The apparatus of claim 18, further comprising:
    means for transmitting data to the central database.

22. A computer apparatus for modeling and recommending deployment of alternative energy distribution, the apparatus comprising:
    means for modeling alternative energy power generation conditions;
    means for predicting future alternative energy power generation conditions based on modeled conditions; and
    means for generating recommendations as to changes in existing alternative energy generation resources as a function of predicted future conditions.

* * * * *

UNITED STATES PATENT AND TRADEMARK OFFICE
CERTIFICATE OF CORRECTION

PATENT NO.       : 7,844,568 B2
APPLICATION NO.  : 11/857957
DATED            : November 30, 2010
INVENTOR(S)      : Fein et al.

It is certified that error appears in the above-identified patent and that said Letters Patent is hereby corrected as shown below:

Column 2, line 16, delete "can not" and insert -- cannot --.

Column 4, line 19, delete "107,108,109" and insert-- 107, 108, 109 --.

Column 6, line 53, delete "304" and insert -- 104 --.

Column 7, line 28, delete "$(F_S, F_D, F_G,)=f(S_p,D_p,G_p,O)$," and insert -- $(F_S,F_D,F_G)=f(S_p,D_p,G_p,O)$, --.

Column 7, line 30, delete "$F_s$," and insert -- $F_S$, --.

Column 7, line 52, delete " $(F_{F_D},F_{F_S},F_{F_G})=f(S_p,D_p,G_p,F_S,F_D,F_G,O)$, " and insert -- $(F_{F_D},F_{F_S},F_{F_G})=f(S_p,D_p,G_p,F_S,F_D,F_G,O)$, --.

Signed and Sealed this
Sixth Day of September, 2011

David J. Kappos
*Director of the United States Patent and Trademark Office*